(12) United States Patent
Tamura et al.

(10) Patent No.: US 6,200,732 B1
(45) Date of Patent: Mar. 13, 2001

(54) PHOTOCURABLE RESIN COMPOSITION

(75) Inventors: Yorikazu Tamura; Tsuneo Hagiwara, both of Kawasaki (JP)

(73) Assignee: Teijin Seikei Co., Ltd., Osaka (JP)

( * ) Notice: Subject to any disclaimer, the term of this patent is extended or adjusted under 35 U.S.C. 154(b) by 0 days.

(21) Appl. No.: 08/837,982

(22) Filed: Apr. 14, 1997

(30) Foreign Application Priority Data

Apr. 15, 1996 (JP) .................................................. 8-116939

(51) Int. Cl.$^7$ .............................. G03F 7/027; G03F 7/26; G03C 9/08
(52) U.S. Cl. ............................. 430/284.1; 522/96; 522/97; 528/75; 528/76; 528/77; 264/401; 560/209; 560/205
(58) Field of Search .................... 430/284.1; 522/96, 522/97; 264/401; 528/75, 76, 77; 560/209, 205

(56) References Cited

U.S. PATENT DOCUMENTS

| | | | |
|---|---|---|---|
| 3,907,865 | * 9/1975 | Miyata et al. | 260/77.5 AN |
| 4,942,060 | * 7/1990 | Grossa | 427/54.1 |
| 4,942,066 | 7/1990 | Fan et al. | 427/54.1 |
| 5,002,854 | 3/1991 | Fan et al. | 430/269 X |
| 5,014,207 | 5/1991 | Lawton | 364/468 |
| 5,292,610 | * 3/1994 | Hellig et al. | 430/284.1 X |
| 5,328,752 | 7/1994 | Miyazato | 428/209 |
| 5,591,563 | * 1/1997 | Suzuki et al. | 430/284.1 |
| 5,679,722 | * 10/1997 | Tamura | 522/96 |
| 5,731,388 | * 3/1998 | Suzuki et al. | 525/404 |
| 5,929,130 | * 7/1999 | Suzuki et al. | 522/81 |

FOREIGN PATENT DOCUMENTS

| | | |
|---|---|---|
| 23 36 264 | 2/1975 | (DE) . |
| 41 09 287 | 9/1992 | (DE) . |
| 43 05 201 | 4/1994 | (DE) . |
| 0506616A1 | * 3/1992 | (EP) ................................ 430/284.1 |
| 0 535 828 | 7/1993 | (EP) . |
| 56-144478 | 11/1981 | (JP) . |
| 60-247515 | 12/1985 | (JP) . |
| 62-35966 | 2/1987 | (JP) . |
| 1-204915 | 8/1989 | (JP) . |
| 1-213304 | 8/1989 | (JP) . |
| 2-28261 | 1/1990 | (JP) . |
| 2-75617 | 3/1990 | (JP) . |
| 2-113925 | 4/1990 | (JP) . |
| 2-145616 | 6/1990 | (JP) . |
| 2-153722 | 6/1990 | (JP) . |
| 3-15520 | 1/1991 | (JP) . |
| 3-21432 | 1/1991 | (JP) . |
| 3-41126 | 2/1991 | (JP) . |
| 3-104626 | 5/1991 | (JP) . |
| 3-114733 | 5/1991 | (JP) . |

OTHER PUBLICATIONS

Derwent Acc No. 1975–14533W, Patent family search results for DE 2336264 A on Derwent file on West Database (in house USPTO). DAte of search Sep. 16, 2000.*

Langer, H. J., Derwent Acc No. 1994–102698, English abstract of DE 4305201 published Apr. 7, 1994. Derwent abstract on line dated Apr. 7, 1994 obtained from West Database (in house USPTO).*

* cited by examiner

*Primary Examiner*—Cynthia Hamilton
(74) *Attorney, Agent, or Firm*—Anderson, Kill & Olick P.C.

(57) ABSTRACT

There is provided a photocurable resin composition comprising (A) an urethane acrylate having three or four acrylate groups in the molecule, (B) a radical polymerizable compound different from the above urethane acrylate; and (C) a photopolymerization initiator, the weight ratio of the urethane acrylate (A) to the radical polymerizable compound (B) being 80:20 to 10:90; and a production process thereof. The said photocurable resin composition can provide moldings and stereolithographed objects having excellent dimensional accuracy with a small volume shrinkage factor at the time of photo-curing and excellent heat resistance with a high thermal deformation temperature as well as excellent transparency and mechanical properties such as tensile strength.

10 Claims, No Drawings

PHOTOCURABLE RESIN COMPOSITION

DETAILED DESCRIPTION OF THE INVENTION

This invention relates to a photocurable resin position, a production method thereof and an urethane acrylate used in the photocurable resin composition. More specifically, it relates to a photocurable resin composition which can provide moldings and stereolithographed objects, i.e., three-dimensionally shaped object, having excellent dimensional accuracy with a small volume shrinkage factor at the time of photo-curing and excellent heat resistance with a high thermal deformation temperature as well as excellent transparency and mechanical properties such as tensile strength; a production method thereof; and an urethane acrylate used in the photocurable resin composition.

Generally speaking, a liquid photocurable resin composition is widely used as a coating agent (especially hard coating agent), photoresist, dental material and the like. In recent years, particular attention has been paid to a method for optically shaping a photocurable resin composition three-dimensionally based on data input into a three-dimensional CAD system. As for optical stereolithography technology, JP-A 56-144478 (the term "JP-A" as used herein means an "unexamined published Japanese patent application") discloses an optical stereolithography which comprises supplying a required amount of controlled optical energy to a liquid photocurable resin to cure it into a thin layer, further supplying a liquid photocurable resin onto the layer, irradiating the resin with light under control to cure it into a thin layer in a laminate manner and repeating this procedure to produce a stereolithographed object. A practical basic method therefor is proposed in JP-A 60-247515. Thereafter, JP-A 62-35966, JP-A 1-204915, JP-A 2-113925, JP-A 2-145616, JP-A 2-153722, JP-A 3-15520, JP-A 3-21432 and JP-A 3-41126 propose also technologies related with an optical stereolithography.

A typical method for optically producing a stereolithographed object comprises selectively irradiating a liquid surface of a liquid photocurable resin composition in a container with light from an ultraviolet laser controlled by a computer to cure it to a predetermined thickness so as to obtain a desired pattern, supplying one layer of the liquid photocurable resin composition on the cured layer, irradiating it with light from the ultraviolet laser similarly to cure it to form a unitarily continuous cured layer and repeating this laminating procedure to produce a stereolithographed object having the final shape. This method is widely employed, and since this method makes it possible to produce a target stereolithographed object having a complex shape in a relatively short period of time with ease, it has been attracting special attention these days.

As the photocurable resin composition used as a coating, photoresist, dental material or the like, curable resins such as unsaturated polyesters, epoxy (meth)acrylate, urethane (meth)acrylate and (meth)acrylic acid ester monomers, to which a photopolymerization initiator is added, are widely used.

Illustrative examples of the photocurable resin composition used in the optical stereolithography include those containing as an essential component at least one photopolymerizable compound such as an photopolymerizable modified (poly)urethane (meth)acrylate compound, oligoester acrylate compound, epoxy acrylate compound, epoxy compound, polyimide compound, aminoalkyd compound or vinyl ether compound and a photopolymerization initiator. In recent years, JP-A 1-204915, JP-A 1-213304, JP-A 2-28261, JP-A 2-75617, JP-A 2-145616, JP-A 104626/1991, JP-A 3-114732 and JP-A 3-1147324 disclose various technologies for improving the photocurable resin composition.

It is necessary that the photocurable resin composition used in the optical stereolithography be a liquid having a low viscosity and have a small volume shrinkage factor at the time of curing from viewpoints of handling properties, stereolithographing speed and stereolithographing accuracy, and that it give a stereolithographed object having excellent mechanical properties when it is photo-cured. In recent years, along with expanding demands and applications of optical stereolithographed objects, stereolithographed objects having excellent heat resistance with a high thermal deformation temperature and transparency in addition to the above characteristics are desired in some applications. For instance, in optical stereolithographed objects used in the design of a complex heating medium circuit and in optical stereolithographed objects used for the analysis of the behavior of a heating medium having a complex structure, great importance is attached to small volume shrinkage factor at the time of photo-curing, high thermal deformation temperature and excellent transparency.

Heretofore, for the purpose of obtaining an optical stereolithographed object having improved heat resistance, there have been studied a method for introducing a benzene ring into the molecule of a photocurable resin, a method for increasing crosslinking density in photo-cured products, and the like. However, the thermal deformation temperatures under high load of stereolithographed objects obtained by these methods are around 70 to 80° C. at best, and the heat resistances thereof are not satisfactory. In addition, when the heat resistance of a photo-cured product is attempted to be improved, the volume shrinkage factor at the time of curing becomes large undesirably, resulting in deterioration in dimensional accuracy. Therefore, a photocurable resin composition which has both improved heat resistance and reduced volume shrinkage factor at the time of curing has not been obtained yet.

Generally, when the crosslinking density in a photo-cured product is increased, improvement in heat resistance is expected, but the volume shrinkage is liable to become large by increasing the crosslinking density at the same time. Therefore, the improvement of heat resistance and the reduction of volume shrinkage factor are antinomic to each other. Although a huge number of photocurable resin compositions have been proposed as described above, a photocurable resin composition which has high heat resistance with a thermal deformation temperature under high load of higher than 100° C. and a small volume shrinkage factor at the time of curing at the same time and further can provide moldings and stereolithographed objects having excellent transparency and mechanical properties has not been provided yet.

It is therefore an object of the present invention to provide a photocurable resin composition which is a liquid having low viscosity and excellent handling properties, can be cured in a short period of irradiation time, and can provide moldings, stereolithographed objects and other cured products having excellent dimensional accuracy with a small volume shrinkage factor at the time of curing, excellent heat resistance with a high thermal deformation temperature and excellent transparency and mechanical properties such as tensile strength; as well as a production method thereof.

It is another object of the present invention to provide a novel urethane acrylate which is used in the above photocurable resin composition.

Other objects and advantages of the present invention will become clear from the following description.

The inventors of the present invention have conducted studies to attain the above objects and as a result, have found that a novel urethane acrylate having a specific chemical structure synthesized by the inventors is extremely effective in achieving the above objects and when this urethane acrylate is mixed with another radical polymerizable compound and a photopolymerization initiator, a liquid photocurable resin composition having low viscosity and excellent handling properties can be obtained, and that the photocurable resin composition can be cured in a short period of time when it is exposed to light and have small volume shrinkage at the time of curing, and hence, a stereolithographed object having a desired shape and size can be produced with a high dimensional accuracy, and in addition, the stereolithographed object obtained by photocuring it has excellent heat resistance with a high thermal deformation temperature of higher than 100° C. as well as excellent transparency and mechanical properties.

The inventors have further found that when at least one filler selected from solid fine particles and whiskers is contained in a photocurable resin composition containing the above novel urethane acrylate discovered by the inventors, a molding or stereolithographed object obtained by curing the resulting composition under irradiation exhibits, while maintaining high mechanical strength, extremely excellent heat resistance with an extremely high thermal deformation temperature, higher than 200° C. in some cases, and extremely high dimensional accuracy with greatly reduced volume shrinkage, which have been unknown conventionally for this type of photocurable resin composition.

The inventors have also found that the above photocurable resin composition can be used effectively not only in the optical stereolithography but also in the production of moldings by curing with irradiation of light, and other applications.

The inventors have found that, in the production of the above photocurable resin composition, when the initial reaction step of the production is carried out using, as a diluent, a radical polymerizable compound which does not react with an isocyanate group, the reaction can be carried out extremely smoothly, and that the reaction product obtained from the reaction can be directly used for the preparation of the photocurable resin composition of the present invention without removing the diluent from the reaction product. The present invention has been accomplished based on these findings.

That is, according to the present invention, firstly, there is provided a photocurable resin composition which comprises:

(A) an urethane acrylate represented by the following formula (I):

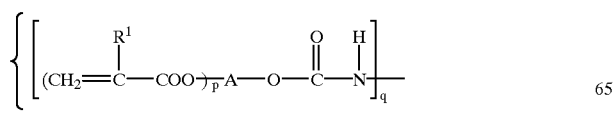

(I)

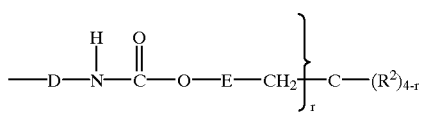

wherein $R^1$ is a hydrogen atom or a methyl group, A is a divalent or trivalent organic residual group which remains after all the hydroxyl groups are removed from a diol or triol, D is a divalent or trivalent organic residual group which remains after all the isocyanate groups are removed from a diisocyanate or triisocyanate, E is a group represented by the formula —(CH$_2$CH$_2$O)$_s$— (s is a numeral of 1 to 4),

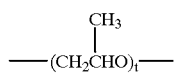

(t is a numeral of 1 to 4), or

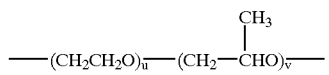

(u and v are each a numeral of 1 to 3, provided that u+v is 2 to 4), $R^2$ is a hydrogen atom or an alkyl group, p and q are independently 1 or 2, and r is 3 or 4, provided that at least one of $R^1$'s is a methyl group when p is 2;

(B) a radical polymerizable compound different from the above urethane acrylate; and (C) a photopolymerization initiator, the weight ratio of the urethane acrylate (A) to the radical polymerizable compound (B) being 80:20 to 10:90.

Particularly preferably, the photocurable resin composition of the present invention further contains at least one filler selected from solid fine particles and whiskers.

According to the present invention, secondly, there is provided a method of producing an optical curable resin composition which comprises the steps of:

(1) reacting a (meth)acrylic acid ester represented by the following formula (II):

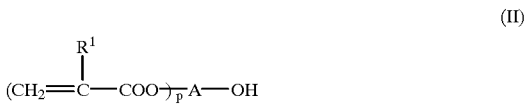

(II)

wherein $R^1$, A and p are the same as defined in the formula (I), with a polyisocyanate represented by the following formula (III):

(III)

wherein D and q are the same as defined in the formula (I), in such a quantitative ratio that the polyisocyanate has one isocyanate group remaining in its one molecule on the average in the presence or absence of a diluent comprising a radical polymerizable compound which does not show reactivity with the isocyanate group to produce a monoisocyanate represented by the following formula (IV):

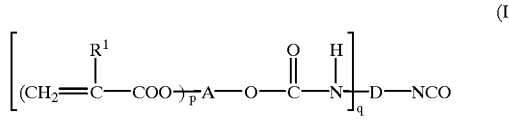
(IV)

wherein $R^1$, A, D, p and q are the same as defined in the above formula (I);

(2) mixing the monoisocyanate obtained in the above step (1) or the reaction product containing the monoisocyanate and a radical polymerizable compound with a polyol compound represented by the following formula (V):

(V)

wherein E, $R^2$ and r are the same as defined in the above formula (I), in a ratio that the isocyanate groups of the monoisocyanate of the formula (IV) is almost equal in equivalent to the hydroxyl groups of the polyol compound and reacting these to produce an urethane acrylate represented by the above formula (I); and (3) adding to the reaction product containing the urethane acrylate (I) obtained in the above step (2) a photopolymerization initiator and a predetermined amount of a radical polymerizable compound when the reaction product does not contain a radical polymerizable compound or a predetermined amount of a radical polymerizable compound to adjust the weight ratio of the urethane acrylate (I) to the radical polymerizable compound to 80:20 to 10:90.

The urethane acrylate represented by the above formula (I) which is produced in the step (2) and used in the photocurable resin composition of the present invention is a novel compound. According to the present invention, there is also provided the urethane acrylate of the formula (I).

The present invention is described in detail hereinafter.

A description is first given of the urethane acrylate (I) represented by the above general formula (I) used in the photocurable resin composition of the present invention.

In the urethane acrylate (I) represented by the formula (I), $R^1$ is a hydrogen atom or a methyl group, p is 1 or 2, and at least one of the groups $R^1$ in the two groups $CH_2=C(R^1)$—COO— when p is 2 must be a methyl group. In the urethane acrylate (I), if the groups $R^1$ in the two groups $CH_2=C(R^1)$—COO— when p is 2 are both a hydrogen atom, it is inevitable to produce, as an intermediate product, glycerine diacrylate which is extremely toxic, carcinogenic and stimulative to the skin. Therefore, it cannot be used virtually and hence, is not preferred.

In the urethane acrylate (I), the group A is the residual group of a diol or triol (that is, the group which remains after all the hydroxyl groups are removed from a diol or triol). As the group A, there can be given the residual group of a diol or triol such as an aliphatic diol having 2 to 5 carbon atoms, alicyclic diol, aromatic diol, aliphatic triol, alicyclic triol or aromatic triol. Of these, it is preferred that the group A is the residual group of a diol such as ethylene glycol, propylene glycol, butylene glycol, ethoxylated bisphenol A or spiroglycol; or the residual group of a triol such as glycerine, trimethylolpropane, 5-methyl-1,2,4-heptanetriol or 1,2,6-hexanetriol. The group A is more preferably the residual group of an ethylene glycol or glycerine alcohol, the most preferably the residual group of a glycerine alcohol.

In the urethane acrylate (I), the group D is a divalent or trivalent organic group which remains after all the isocyanate groups are removed from a diisocyanate or triisocyanate, preferably a divalent or trivalent non-substituted or substituted hydrocarbon group, more preferably a non-substituted or substituted aliphatic, aromatic or alicyclic divalent or trivalent hydrocarbon group having 6 to 20 carbon atoms.

The urethane acrylate (I) can be preferably produced from a (meth)acrylic acid ester (II) represented by the above general formula (II) and a polyisocyanate compound (III) represented by the above general formula (III), as will be described later in detail. In this connection, the group D is a divalent or trivalent residual group which remains after all the isocyanate groups are removed from the polyisocyanate compound used in the production of the urethane acrylate (I), that is, from a diisocyanate compound or triisocyanate compound. Preferred examples of the group D in the urethane acrylate (I) include isophorone, tolylene, 4,4'-diphenylmethane, naphthylene, xylylene, phenylene, 3,3'-dichloro-4,4'-phenylmethane, tolylene, hexamethylene, 4,4'-dicyclohexylmethane, hydrogenated xylylene, hydrogenated diphenylmethane, triphenylenemethane, tetramethylxylene and the like. Out of these, the group D is more preferably isophorone and/or tolylene. In this case, the volume shrinkage factor and heat resistance of a photo-cured product such as a stereolithographed object or a molding obtained from the photocurable resin composition of the present invention containing the urethane acrylate (I) are well balanced with ease.

In the urethane acrylate (I), when the group D is a divalent hydrocarbon group, q is 1 and when the group D is a trivalent hydrocarbon group, q is 2. In other words, in the preparation of the urethane acrylate (I), when a diisocyanate compound represented by the general formula D—$(NCO)_2$ (D is the same meaning as above) is used as the polyisocyanate compound (III), q is 1 and when a triisocyanate compound represented by the general formula D—$(NCO)_3$ (D is the same meaning as above) is used, q is 2.

In the urethane acrylate (I), the group E is a (poly) ethylene oxide group represented by the formula —$(CH_2CH_2O)_s$— (s is a numeral of 1 to 4), a (poly)propylene oxide group represented by the formula —$[CH_2CH(CH_3)O]_t$— (t is a numeral 1 to 4) or a (poly)ethylene oxide propylene oxide group represented by the formula —$(CH_2CH_2O)_u[CH_2CH(CH_3)O]_v$— (u and v are each a numeral of 1 to 3 and u+v is 2 to 4). In the group E, that is, a (poly)ethylene oxide group or (poly)propylene oxide group represented by the above formulas, s and t are each preferably a numeral of 1 to 3, more preferably 1 or 2.

In the (poly)ethylene oxide propylene oxide group represented by the above formula, the total of u and v is preferably 2 or 3, more preferably 2. Particularly, when the group E in the urethane acrylate (I) is a (poly)propylene oxide group represented by the formula —$[CH_2CH(CH_3)O]_t$— (t is preferably 1 to 3, more preferably 1 or 2), a photocurable resin composition having excellent heat resistance with a higher thermal deformation temperature, a smaller volume shrinkage factor at the time of curing as well as a relatively low viscosity can be obtained advantageously.

When s and t are larger than 4 in the group E, the thermal deformation temperature of a photo-cured product obtained from the photocurable resin composition is not sufficiently high and the heat resistance thereof does not reach a desired level, even if an appropriate compound is selected as the other radical polymerizable compound.

On the other hand, when s or t is 0, that is, when the urethane acrylate (I) has no ethylene oxide group or propylene oxide group, a target molding or stereolithographed object cannot be produced with a high dimensional accuracy because of large volume shrinkage at the time of curing, though the improvement of heat resistance is observed. In addition, gelation is liable to occur in the synthesis of the urethane acrylate and the obtained urethane acrylate has an abnormally high viscosity and hence, cannot be used in the photocurable resin composition of the present invention.

In the urethane acrylate (I), the group $R^2$ is a hydrogen atom or an alkyl group and r is 3 or 4. The group $R^2$ is preferably a lower alkyl group having 1 to 4 carbon atoms, more preferably a methyl group or an ethyl group.

Not by way of limitation, illustrative examples of the urethane acrylate (I) usable in the photocurable resin composition of the present invention are given below.

(1) urethane acrylate of the above formula (I) in which p is 1, $R^1$ is a hydrogen atom or a methyl group, q is 1, D is a divalent non-substituted or substituted aromatic, aliphatic or alicyclic hydrocarbon group and r is 4, and four urethane acrylate groups represented by the formula $CH_2=C(R^1)COO—A—OOC—NH—D—NH—COO—E—CH_2—$ are bonded to the one carbon atom.

(2) urethane acrylate of the above formula (I) in which p is 1, $R^1$ and $R^2$ are each a hydrogen atom or a methyl group, q is 1, D is a divalent non-substituted or substituted aromatic, aliphatic or alicyclic hydrocarbon group and r is 3, and three urethane acrylate groups represented by the formula $CH_2=C(R^1)COO—A—OOC—NH—D—NH—COO—E—CH_2—$ are bonded to the one carbon atom (the carbon atom bonded to the residual group $R^2$).

(3) urethane acrylate of the above formula (I) in which p is 2, one of two $R^1$'s is a hydrogen atom and the other is a methyl group, q is 1, D is a divalent non-substituted or substituted aromatic, aliphatic or alicyclic hydrocarbon group and r is 4, and four urethane acrylate groups represented by the formula $[CH_2=C(R^1)COO]_2—A—OOC—NH—D—NH—COO—E—CH_2—$ are bonded to the one carbon atom [that is, urethane acrylate (I) having 8 meth(acrylate) groups in one molecule].

(4) urethane acrylate of the above formula (I) in which p is 2, one of two $R^1$'s is a hydrogen atom and the other is a methyl group, $R^2$ is a hydrogen atom or a methyl group, q is 1, D is a divalent non-substituted or substituted aromatic, aliphatic or alicyclic hydrocarbon group and r is 3, and three urethane acrylate groups represented by the formula $[CH_2=C(R^1)COO]_2—A—OOC—NH—D—NH—COO—E—CH_2—$ are bonded to the one carbon atom (the carbon atom bonded to the residual group $R^2$) [that is, urethane acrylate (I) having 6 (meth)acrylate groups in one molecule].

(5) urethane acrylate of the above formula (I) in which p is 1, $R^1$ is a hydrogen atom or a methyl group, q is 2, D is a trivalent non-substituted or substituted aromatic, aliphatic or alicyclic hydrocarbon group and r is 4, and four urethane acrylate groups represented by the formula $[CH_2=C(R^1)COO—A—OOC—NH]_2—D—NH—COO—E—CH_2—$ are bonded to the one carbon atom [that is, urethane acrylate (I) having 8 (meth)acrylate groups in one molecule].

(6) urethane acrylate of the above formula (I) in which p is 1, $R^1$ and $R^2$ are each a hydrogen atom or a methyl group, q is 2, D is a trivalent non-substituted or substituted aromatic, aliphatic or alicyclic hydrocarbon group and r is 3, and three urethane acrylate groups represented by the formula $[CH_2=C(R^1)COO—A—OOC—NH]_2—D—NH—COO—E—CH_2—$ are bonded to the one carbon atom [that is, urethane acrylate (I) having 6 (meth)acrylate groups in one molecule].

(7) urethane acrylate of the above formula (I) in which p is 2, one of $R^1$'s is a hydrogen atom and the other is a methyl group, q is 2, D is a trivalent non-substituted or substituted aromatic, aliphatic or alicyclic hydrocarbon group and r is 4, and four urethane acrylate groups represented by the formula $\{[CH_2=C(R^1)COO]_2—A—OOC—NH\}_2—D—NH—COO—E—CH_2—$ are bonded to the one carbon atom [that is, urethane acrylate (I) having 16 (meth)acrylate groups in one molecule].

(8) urethane acrylate of the above formula (I) in which p is 2, one of $R^1$'s is a hydrogen atom and the other is a methyl group, $R^2$ is a hydrogen atom or a methyl group, q is 2, D is a trivalent non-substituted or substituted aromatic, aliphatic or alicyclic hydrocarbon group and r is 3, and three urethane acrylate groups represented by the formula $\{[CH_2=C(R^1)COO]_2—A—OOC—NH\}_2—D—NH—COO—E—CH_2—$ are bonded to the one carbon atom [that is, urethane acrylate (I) having 12 (meth)acrylate groups in one molecule].

Further, the photocurable resin composition of the present invention contains a radical polymerizable compound different from the urethane acrylate (I) (other radical polymerizable compound) (which may be simply referred to as "radical polymerizable compound" hereinafter sometimes) in addition to the urethane acrylate (I). Any radical polymerizable compound having a carbon-carbon unsaturated bond can be used if it can form a cured product by reacting with the urethane acrylate (I) or a radical polymerizable compound upon exposure to the light. Particularly, acrylic compounds, allyl compounds and/or vinyl lactams are preferred.

The radical polymerizable compound may be a monofunctional or polyfunctional compound or a combination of monofunctional and polyfunctional compounds. Further, the radical polymerizable compound may be a low-molecular weight monomer or oligomer or as the case may be, a compound having a relatively large molecular weight. The photocurable resin composition of the present invention may contain either only one radical polymerizable compound or two or more radical polymerizable compounds.

Not by way of limitation, illustrative examples of the radical polymerizable compound which can be used as a radical polymerizable compound in the photocurable resin composition of the present invention include (meth) acrylates such as isobornyl (meth)acrylate, bornyl (meth) acrylate, dicyclopentenyl (meth)acrylate, 2-hydroxyethyl (meth)acrylate, 2-hydroxypropyl (meth)acrylate, (poly) propylene glycol mono(meth)acrylate and t-butyl (meth) acrylate; (meth)acrylamides such as morpholine (meth) acrylamide; monofunctional radical polymerizable compounds such as N-vinylcaprolactone and styrene; and polyfunctional radical polymerizable compounds such as trimethylolpropane tri(meth)acrylate, ethylene oxide-modified trimethylolpropane tri(meth)acrylate, ethylene glycol di(meth)acrylate, diethylene glycol (meth)acrylate, triethylene glycol (meth)acrylate, tetraethylene glycol di(meth)acrylate, polyethylene glycol (meth)acrylate, 1,4-butanediol di(meth)acrylate, 1,6-hexanediol di(meth) acrylate, neopentyl glycol di(meth)acrylate, dicyclopentenyl di(meth)acrylate, diaryl phthalate, diaryl fumarate and ethylene oxide-modified bisphenol A diacrylate.

In addition to the radical polymerizable compounds listed above, epoxy compounds, urethane acrylates other than the urethane acrylate (I), epoxy (meth)acrylate compounds and other ester (meth)acrylates which have been conventionally used in resin compositions for optically producing a stereolithographed object can be used as the radical polymerizable compound.

In the photocurable resin composition of the present invention, the above radical polymerizable compounds may be used alone or in combination of two or more. Of the above radical polymerizable compounds, morpholine (meth) acrylamide, dicyclopentenyl di(meth)acrylate and N-vinyl caprolactam are preferably used in the photocurable resin composition of the present invention. In this case, there can be obtained a photocurable resin composition which can provide moldings, stereolithographed objects or other cured products having excellent dimensional accuracy with a small volume shrinkage factor at the time of curing and excellent heat resistance with a high thermal deformation temperature as well as excellent transparency and rigidity.

In the photocurable resin composition of the present invention, the weight ratio of the urethane acrylate (I) to the radical polymerizable compound must be 80:20 to 10:90, preferably 65:35 to 25:75, more preferably 60:40 to 35:65.

In the photocurable resin composition, if the proportion of the urethane acrylate (I) is less than 10% by weight based on the total weight of the urethane acrylate (I) and the radical polymerizable compound, a cured product such as a molding or stereolithographed object having excellent heat resistance and rigidity cannot be obtained when it is cured under irradiation. On the other hand, if the proportion is more than 80% by weight, the dimensional accuracy of the obtained photocurable resin composition will deteriorate with a large volume shrinkage factor at the time of photo-curing and the viscosity thereof will becomes too high, resulting in deterioration in handling properties, moldability and shapability and making it impossible to produce a target stereolithographed object smoothly particularly when it is used in an optical stereolithography.

Further, the photocurable resin composition of the present invention contains a photopolymerization initiator together with the above urethane acrylate (I) and the other radical polymerizable compound. Any photo-radical polymerization initiator which has been conventionally used in a photocurable resin composition may be used without restriction. Not by way of limitation, illustrative examples of the photopolymerization initiator which can be used in the photocurable resin composition of the present invention include 2,2-dimethoxy-2-phenylacetophenone, 1-hydroxycyclohexylphenyl ketone, diethoxy acetophenone, acetophenone, 3-methylacetophenone, 2-hydroxymethyl-1-phenylpropane-1-one, 4'-isopropyl-2-hydroxy-2-propiophenone, 2-hydroxy-2-methyl-propiophenone, p-dimethylaminoacetophenone, p-t-butyldichloroacetophenone, p-t-butyltrichloroacetophenone, p-azidobenzalacetophenone, 1-hydroxycyclohexylphenyl ketone, benzophenone, methyl o-benzoyl benzoate, Michler's ketone, 4,4'-bisdiethylaminobenzophenone, xanthone, fluorenone, fluorene, benzaldehyde, anthraquinone, triphenylamine, carbazole and the like.

When a compound having a cationic polymerizable group such as an epoxy group is used as the radical polymerizable compound together with a radical polymerizable group, an optical cationic polymerization initiator may be used in conjunction with the above photo-radical polymerization initiator. In this case, the optical cationic polymerization initiator is not limited to a particular kind, and the heretofore known ones can be used.

The amount of the photopolymerization initiator used may vary depending on types of the urethane acrylate (I), the radical polymerizable compound and the photopolymerization initiator. Generally, the amount is preferably 0.1 to 10% by weight, more preferably 1 to 5% by weight, based on the total weight of the urethane acrylate (I) and the radical polymerizable compound.

According to the present invention, a photocurable resin composition which further comprises at least one filler selected from solid fine particles and whiskers is also included in the scope of the present invention.

The photocurable resin composition of the present invention which contains a filler selected from solid fine particles and whiskers can provide a molding or stereolithographed object having more excellent dimensional accuracy with a further reduced volume shrinkage factor at the time of photo-curing. In addition, a molding and a stereolithographed object obtained by optically curing the photocurable resin composition containing at least one filler selected from solid fine particles and whiskers have more excellent heat resistance with an extremely high thermal deformation temperature, with a thermal deformation temperature higher than 200° C. in some cases, while maintaining its excellent mechanical properties.

The photocurable resin composition of the present invention may contain only one or a plurality of fillers selected from solid fine particles and whiskers. In other words, the photocurable resin composition of the present invention may contain one or a plurality of solid fine particles, one or a plurality of whiskers, or both of one or a plurality of solid fine particles and one or a plurality of whiskers. When the photocurable resin composition of the present invention contains both solid fine particles and whiskers, the volume shrinkage thereof at the time of photo-curing becomes smaller and the thermal deformation temperature of the photo-cured product becomes extremely high, making it possible to obtain a photo-cured product such as a molding or a stereolithographed object having more excellent dimensional accuracy and heat resistance.

The content of a filler(s) selected from solid fine particles and whiskers in the photocurable resin composition can be adjusted according to types and forms of the solid fine particle and/or whisker. Generally speaking, it is preferably 3 to 70% by volume, more preferably 20 to 65% by volume, the most preferably 30 to 60% by volume, based on the volume of the photocurable resin composition before it contains solid fine particles and/or whiskers.

Particularly when the photocurable resin composition of the present invention contains only solid fine particles and does not contain whiskers, the content of the solid fine particles is preferably 3 to 70% by volume based on the volume of the photocurable resin composition of the present invention before it contains the solid fine particles. When the photocurable resin composition of the present invention contains only whiskers and does not contain solid fine particles, the content of the whiskers is preferably 3 to 30% by volume based on the volume of the photocurable resin composition before it contains the whiskers.

By setting the contents of the solid fine particles and/or the whiskers in the photocurable resin composition to the above ranges, a molding or stereolithographed object having excellent dimensional accuracy and heat resistance can be obtained. On the other hand, when the contents of the solid fine particles and/or the whiskers are outside the above ranges, the viscosity of the photocurable resin composition becomes too high with the result of deterioration in handling properties and operation at the time of photo-curing.

The solid fine particles to be contained in the photocurable resin composition are preferably inorganic solid fine particles and organic polymer solid fine particles which have a smooth surface almost free from undergoing irregular reflection at the time of exposure to light (exposure to energy beams) and do not cause the decomposition or modification of a photo-cured product such as a molding or stereolithographed object at a temperature at which the cured product is used. Solid fine particles of such a smooth spherical shape having a relative standard deviation value of sphericity represented by the following expression (1) of 0.5 or less, are preferably used. When solid fine particles having the above relative standard deviation value of 0.5 or less are used, photo-curing is performed uniformly because light (energy beams) is prevented from being reflected irregularly by the solid fine particles when the photocurable resin composition is cured optically. Therefore, a photo-cured product having more excellent dimensional accuracy can be obtained and yet an excessive increase in the viscosity of the photocurable resin composition is prevented.

Relative standard deviation of sphericity=

$$\sqrt{\left(\sum_{i}^{n} \frac{(D_i - D)^2}{n}\right)} / D \quad (1)$$

wherein Di is an area circle equivalent diameter ($\mu$m) of each particle, D is an average value of area circle equivalent diameter $$\left(\sum_{i}^{n} Di/n\right) (\mu m)$$

and n is a number of particle.

The solid fine particles preferably have an average particle size of 3 to 70 $\mu$m, more preferably 10 to 60 $\mu$m, particularly preferably 15 to 50 $\mu$m. If the average particle size of the solid fine particles is less than 3 $\mu$m, the viscosity of the photocurable resin composition will be too high, while if it is more than 70 $\mu$m, the dimensional accuracy of a photo-cured product such as a molding or a stereolithographed object will lower because the diffusion of activation energy occurs on irradiation.

The solid fine particles may be transparent or opaque and selected according to type and application of a target molding or stereolithographed object. For the purpose of obtaining a photo-cured product having excellent transparency while improving heat resistance, it is possible to suppress a rise in the viscosity of the photocurable resin composition by reducing the solid fine particles to a submicron order in size, subjecting to an appropriate surface treatment and dispersing stably in the photocurable resin composition.

Illustrative examples of the solid fine particles preferably usable in the present invention include inorganic solid fine particles such as glass beads, talc fine particles and silicon oxide fine particles; crosslinked polystyrene-based fine particles, crosslinked polymethacrylate-based fine particles, polyethylene-based fine particles, polypropylene-based fine particles and the like. These solid fine particles may be used alone or in combination of two or more or may be used in conjunction with whiskers.

When the solid fine particles treated with at least one member of silane coupling agents such as aminosilane, epoxysilane or acrylsilane are used, advantageously, the mechanical strength of a photo-cured product is improved in many cases. When polyethylene-based solid fine particles and/or polypropylene-based solid fine particles treated with a silane coupling agent(s) are contained in the photocurable resin composition, use of polyethylene-based solid fine particles and/or polypropylene-based solid fine particles containing, as a copolymer component, 1 to 10% by weight of an acrylic acid-based compound is preferred because the affinity of the photocurable resin composition with the silane coupling agent is improved.

The whiskers to be contained in the photocurable resin composition preferably have a diameter of 0.3 to 1 $\mu$m, a length of 10 to 70 $\mu$m and an aspect ratio of 10 to 100, more preferably a diameter of 0.3 to 0.7 $\mu$m, a length of 20 to 50 $\mu$m and an aspect ratio of 20 to 70. When the aspect ratio of the whiskers is less than 10, the effects of improving the mechanical properties and reducing the volume shrinkage of the photocurable resin composition are hard to be obtained and yet the viscosity thereof is apt to increase.

On the other hand, when the aspect ratio of the whiskers is large, the effects of improving the mechanical properties and reducing the volume shrinkage are expected. However, if the aspect ratio is too large, the viscosity and fluid elasticity of the photocurable resin composition will increase with the result that a shaping operation becomes difficult or the dimensional accuracy of the obtained photo-cured product, particularly the dimensional accuracy of the side surface of the photo-cured product is apt to lower. Therefore, the aspect ratio is preferably not more than 100.

Illustrative examples of the whiskers preferably usable in the present invention include whiskers of aluminum borate compounds, hydroxylated magnesium sulfate compounds, aluminum oxide, titanium oxide compounds and silicon oxide compounds. These whiskers may be used alone or in combination of two or more, or in conjunction with the above solid fine particles. Of these, whiskers of aluminum borate-based compounds are preferred.

When the whiskers are treated with at least one silane coupling agent selected from aminosilane, epoxysilane, acrylsilane and the like, the mechanical strength of a cured product obtained by photo-curing is improved advantageously in many cases.

The photocurable resin composition of the present invention may contain a leveling agent, surfactant, organic polymer modifier, organic plasticizer and the like as required in addition to the above components.

The viscosity of the photocurable resin composition of the present invention can be adjusted according to its application or mode of use. Generally, when it is measured using a rotary B type viscometer, it is preferably in the range of 100 to 100,000 cp, more preferably 300 to 50,000 cp, at normal temperature (25° C.) from viewpoints of handling properties, moldability and properties for stereolithography. Particularly when the photocurable resin composition of the present invention is used to form a stereolithographed object, it is preferred to set the viscosity at normal temperature to 300 to 5,000 cp so as to achieve excellent handling properties in the optical production of a stereolithographed object and smoothly produce a target stereolithographed object with a high dimensional accuracy. The viscosity of the photocurable resin composition can be adjusted by selecting kinds of the urethane acrylate (I) and the radical polymerizable compound and controlling the blend ratio of these.

When the photocurable resin composition of the present invention is preserved in a state capable of shading light, it can be generally preserved for about 6 to 18 months at a temperature of 10 to 40° C. while its good photo-curing property is maintained and its modification and polymerization are prevented.

The method of producing the urethane acrylate (I) of the present invention and the method of producing the photocurable resin composition of the present invention which contains the urethane acrylate (I) and the photocurable resin composition of the present invention which further contains at least one filler selected from solid fine particles and whiskers are not particularly limited. Regardless of whatsoever methods, the urethane acrylate (I) represented by the above general formula (I), the photocurable resin composition containing the same, and the photocurable resin composition containing at least one filler selected from solid fine particles and whiskers are included in the scope of the present invention.

Particularly, the urethane acrylate (I) of the present invention and the photocurable resin composition containing the same can be preferably produced by the following method.
<Typical production methods of urethane acrylate (I) and photocurable resin composition containing the same>
Step (I)

Firstly, a (meth)acrylic acid ester (II) represented by the following general formula (II):

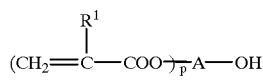

(II)

wherein $R^1$, A and p are the same as defined above, and a polyisocyanate compound (III) represented by the following general formula (III):

(III)

wherein D and q are the same as defined above, are used in such a quantitative ratio that the polyisocyanate compound (III) has one isocyanate group remaining in its one molecule on the average to produce a monoisocyanate compound (IV) represented by the following general formula (IV):

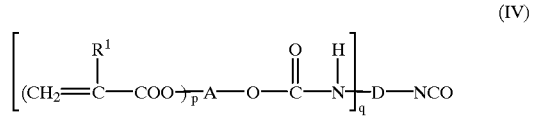

(IV)

wherein $R^1$, A, D, p and q are the same as defined above.

In this step (1), when the polyisocyanate compound (III) is a diisocyanate compound and about 1.0 to 1.2 moles of the (meth)acrylic acid ester (II) is reacted with one mole of the diisocyanate compound, the monoisocyanate compound (IV) of the above formula (IV) in which q is 1 is obtained. When the polyisocyanate compound (III) is a triisocyanate compound and about 2.0 to 2.4 moles of the (meth)acrylic acid ester (II) is reacted with 1 mole of the triisocyanate compound, the monoisocyanate compound (IV) of the above formula (IV) in which q is 2 is obtained.

The polyisocyanate compound (III) used in this step (1) may be either of an diisocyanate compound and an triisocyanate compound which are included in the category of the above general formula (III), and is not particularly limited. Of these, preferred examples of the polyisocyanate compound (III) include isophorone diisocyanate, tolylene diisocyanate, 4,4'-diphenylmethane diisocyanate, naphthylene diisocyanate, xylylene diisocyanate, phenylene diisocyanate, 3,3'-dichloro-4,4'-phenylmethane diisocyanate, tolylene diisocyanate, hexamethylene diisocyanate, 4,4'-dicyclohexylmethane diisocyanate, hydrogenated xylylene diisocyanate, triphenylmethane triisocyanate, tetramethylxylene diisocyanate, hydrogenated 4,4'-diphenylmethane diisocyanate and the like. These isocyanate compounds may be used alone or in combination of two or more. Of the above isocyanate compounds, isophorone diisocyanate and tolylene diisocyanate are particularly preferred. When isophorone diisocyanate or tolylene diisocyanate are used, the volume shrinkage factor at the time of photo-curing and heat resistance of a photo-cured product such as a stereolithographed object obtained from the photocurable resin composition of the present invention can be balanced with ease.

This step (1) for producing a monoisocyanate compound (IV) is preferably carried out by reacting the (meth)acrylic acid ester (II) and the polyisocyanate compound (III) at a temperature of 40 to 100° C. using a conventionally known urethanating catalyst such as an organotin catalyst or a tertiary amine catalyst.

Further, in this step (1), the (meth)acrylic acid ester (II) may be reacted with the polyisocyanate compound (III) directly without a diluent or may be reacted with the polyisocyanate compound (III) using a diluent. Of the above two methods, it is preferred that the reaction of the step (1) is carried out in the presence of an appropriate diluent which does not react with an isocyanate group because the (meth) acrylic acid ester (II) used as a starting material component in this step (1) and the monoisocyanate compound (IV) obtained in this step (1) generally have a high viscosity in many cases. When the diluent is used, the heating and mixing of the reaction components are carried out uniformly and hence, a reaction proceeds smoothly to obtain the target monoisocyanate compound (IV) having a low viscosity. The amount of the diluent used may vary depending on types of the (meth)acrylic acid ester (II), the polyisocyanate compound (III) and the diluent. Generally, the amount of the diluent is preferably about 10 to 65% by weight based on the total weight of the (meth)acrylic acid ester (II) and the polyisocyanate compound (III).

Any diluent may be used insofar as it is an organic solvent which can dissolve the (meth)acrylic acid ester (II) and the polyisocyanate compound (III) and does not react with an isocyanate group. It is particularly desired to select a radical polymerizable compound which does not react with an isocyanate group from other radical polymerizable compounds which can be contained in the photocurable resin composition of the present invention, and use it as a diluent.

When a radical polymerizable compound which does not react with an isocyanate group is used as a diluent, the diluent does not need to be removed from the reaction product and the reaction product containing the diluent which is a radical polymerizable compound can be used directly in the subsequent step (2) for producing the urethane acrylate (I). The presence of the diluent in the step (2) is particularly preferred because it contributes to smooth proceeding of a reaction. The reaction product containing the urethane acrylate (I) and the radical polymerizable compound obtained in the subsequent step (2) can be also directly used in the production of the photocurable resin composition of the present invention.

When the radical polymerizable compound is used as a diluent in this step (1), the amount of the diluent which is the radical polymerizable compound may be part or all of the radical polymerizable compound used in the photocurable resin composition finally obtained in a step (3) to be described later. In short, it may be such an amount that the reaction of this step (1) can proceed smoothly and the amount of the radical polymerizable compound contained in the target photocurable resin composition is within an allowable range.

Not by way of limitation, illustrative examples of the diluent preferably used in this step (1) include radical polymerizable compounds such as morpholine acrylamide, dicyclopentanyl diacrylate, phenoxydiethyl acrylate and N-vinylcaprolactam. These diluents may be used alone or in combination of two or more. Of these, morpholine acrylamide and dicyclopentanyl diacrylate are preferred.

Step (2):

A polyol compound (V) represented by the following general formula (V):

(V)

wherein $R^2$, E and r are the same as defined above, is mixed and reacted with a reaction product comprising the monoisocyanate compound (IV) represented by the above general formula (IV) obtained in the above step (1) or a reaction product containing the monoisocyanate compound (IV) and a diluent such as a radical polymerizable compound in a ratio that the residual isocyanate groups contained in the monoisocyanate compound (IV) are almost equal in equivalent to hydroxyl groups contained in the polyol compound (V), to produce the urethane acrylate (I) represented by the above general formula (I) or a reaction product containing the urethane acrylate (I) and a radical polymerizable compound.

In this step (2), when the polyol compound (V) is a triol compound (r=3) and about 3.0 to 3.6 moles of the monoisocyanate compound (IV) are reacted with 1 mole of the triol compound, the urethane acrylate (I) of the above formula (I) in which r is 3 can be obtained. When the polyol compound (V) is a tetraol compound (r=4) and about 4.0 to 4.8 moles of the monoisocyanate compound (IV) are reacted with 1 mole of the tetraol compound, the urethane acrylate (I) of the above general formula (I) in which r is 4 can be obtained.

The polyol compound (V) may be either of the above polyol compounds insofar as it satisfies the above general formula (V), and is not limited to a particular kind. Typical examples of the polyol compound (V) include addition products of pentaerythritol with ethylene oxide, in which 1 to 4 moles of ethylene oxide are added to each of four hydroxyl groups of pentaerythritol; addition products of pentaerythritol with propylene oxide, in which 1 to 4 moles of propylene oxide are added to each of four hydroxyl groups of pentaerythritol; addition products of pentaerythritol with ethylene oxide and propylene oxide, in which 1 to 4 moles of ethylene oxide and propylene oxide are added to each of four hydroxyl groups of pentaerythritol; addition products of trimethylolpropane with ethylene oxide, in which 1 to 4 moles of ethylene oxide are added to each of three hydroxyl groups of trimethylolpropane; addition products of trimethylolpropane with propylene oxide, in which 1 to 4 moles of propylene oxide are added to each of three hydroxyl groups of trimethylolpropane; addition products of trimethylolpropane with ethylene oxide and propylene oxide, in which 1 to 4 moles of ethylene oxide and propylene oxide are added to each of three hydroxyl groups of trimethylolpropane; and the like.

When the step (2) for producing the urethane acrylate (I) is generally carried out at a temperature of 40 to 100° C. using a cationic catalyst, anionic catalyst or organotin catalyst as required, the target urethane acrylate (I) can be obtained efficiently. The same diluent as in the above step (1) may be further added in this step (2) to carry out a reaction as the case may be. In this step (2), the urethane acrylate (I) or a reaction product containing the urethane acrylate (I) and a radical polymerizable compound is obtained.

The urethane acrylate (I) obtained in this step (2) varies in properties depending on kinds of groups $R^1$, $R^2$, A, D and E and the numerals of p, q, r, s and t in the formula of the urethane acrylate (I), but it is generally in the form of a liquid having a low to high viscosity at normal temperature and in particular, the reaction product obtained in the form of an admixture of the urethane acrylate (I) and the radical polymerizable compound in this step (2) is a liquid having a low to medium viscosity and has excellent handling properties.

Step (3):

The reaction product comprising the urethane acrylate (I) or the reaction product containing the urethane acrylate (I) and the radical polymerizable compound, which have been obtained in the above step (2) is used to produce the photocurable resin composition of the present invention in this step (3). The photocurable resin composition can be produced by any one of the following methods (a) to (d).

(a) When the reaction product obtained in the above step (2) does not contain the radical polymerizable compound and is composed of the urethane acrylate (I) only, in this step (3), at least one other radical polymerizable compound different from the urethane acrylate (I) is mixed with the urethane acrylate (I) in a weight ratio of the urethane acrylate (I) to the other radical polymerizable compound of 80:20 to 10:90 and a photopolymerization initiator is added to the resulting mixture to produce the photocurable resin composition of the present invention.

(b) When the reaction product obtained in the above step (2) contains the urethane acrylate (I) and a diluent other than a radical polymerizable compound, the diluent is removed in this step (3), and then at least one other radical polymerizable compound is mixed with the urethane acrylate (I) in a weight ratio of the urethane acrylate (I) to the other radical polymerizable compound of 80:20 to 10:90, and a photopolymerization initiator is added to the resulting mixture to produce the photocurable resin composition of the present invention.

(c) When the reaction product obtained in the above step (2) contains the urethane acrylate (I) and a radical polymerizable compound (diluent) and the content of the radical polymerizable compound reaches already the content of the radical polymerizable compound in the photocurable resin composition which is the final object of the present invention, a photopolymerization initiator is directly added to the reaction product to produce the photocurable resin composition of the present invention containing the urethane acrylate (I) and the radical polymerizable compound in a weight ratio of 80:20 to 10:90.

(d) When the reaction product obtained in the above step (2) contains the urethane acrylate (I) and a radical polymerizable compound (diluent) but the content of the radical polymerizable compound is smaller than the content of the radical polymerizable compound in the photocurable resin composition which is the final object of the present invention, at least one other radical polymerizable compound is added to the reaction product in such an amount that a weight ratio of the urethane acrylate (I) to the total of the radical polymerizable compounds becomes 80:20 to 10:90, and a photopolymerization initiator is added to the resulting mixture to produce the photocurable resin composition of the present invention.

Further, when at least one filler selected from solid fine particles and whiskers is contained in the photocurable resin composition of the present invention, at least one filler selected from solid fine particles and whiskers may be added to, and uniformly mixed with, the photocurable resin composition obtained in the above step (3).

The photocurable resin composition of the present invention can be used for various applications, utilizing its characteristic feature that it provides moldings, stereolithographed objects and other cured products having excellent dimensional accuracy with a small volume shrinkage factor when it is photo-cured, excellent heat resistance with a high thermal deformation temperature and transparency. For example, it can be used for the production of stereolithographed objects by means of an optical stereolithography; the production of various moldings such as film product and mold products by means of a flow-casting or casting; coating;and the like.

Of these, the photocurable resin composition of the present invention is the most suitable for use in the production of stereolithographed objects by the above-mentioned optically stereolithography. In this case, stereolithographed objects having excellent dimensional accuracy, heat resistance, rigidity and transparency can be produced smoothly while keeping a small volume shrinkage factor at the time of photo-curing.

For practicing an optical stereolithography using the photocurable resin composition of the present invention, any conventionally known optical stereolithographic methods and devices can be used. Of these, activation energy beams generated from an Ar laser, He-Cd laser, xenon lamp, metal halide lamp, mercury lamp and fluorescent lamp are preferably used as optical energy for curing the resin in the present invention. A laser beam is particularly preferred. When a laser beam is used as an activation energy beam, it is possible to reduce the stereolithographing time by increasing energy level and yet to obtain a stereolithographed object having a high stereolithographing accuracy by using the high converging property of the laser beam.

As described above, for practicing the optical stereolithography using the photocurable resin composition of the present invention, any known method and any known optical stereolithographing system device can be used without restrictions. However, a typical example of the optical stereolithographic method preferably used in the present invention comprises the steps of forming a cured layer by selectively irradiating a liquid photocurable resin composition containing an optical energy absorber with an activation energy beam to obtain a cured layer having a desired pattern, then supplying an uncured liquid photocurable resin composition onto the cured layer, irradiating the resin composition with the activation energy beam similarly to newly forming a cured layer which is unitarily connected with the above cured layer, and repeating this lamination operation to obtain a stereolithographed object which is the final object.

The thus obtained stereolithographed object may be used directly, or as the case may be, may be used after post-curing by irradiation or by heat to further improve mechanical properties and shape stability.

The structure, shape and size of the stereolithographed object are not particularly limited and can be determined according to each application purpose. Typical application fields of the optical stereolithography of the present invention include the production of shaped products for verifying outer appearance in the middle of designing, shaped products for checking the functionality of parts, resin molds for fabricating molds, base shaped products for fabricating molds and direct molds for fabricating mold prototypes. More specifically, the method of the present invention can be used for the production of shaped products and processing shaped products for precision parts, electric and electronic parts, furniture, buildings, auto parts, containers, castings, molds and mother dies. Particularly, it can be used very effectively for the trial production of high-temperature parts, the design of a complex heating medium circuit, the production of parts for the behavioral analysis and planning of a complex-structured heating medium and the like.

The following examples are given to further illustrate the present invention. However, it is to be understood that the scope of the present invention is not limited by the following examples.

SYNTHESIS EXAMPLE 1

[production of reaction product containing urethane acrylate (I) and radical polymerizable compound]

(1) 888 Grams of isophorone diisocyanate, 906 g of morpholine acrylamide and 1.0 g of dibutyltin dilaurate were charged into a 5-liter three-necked flask equipped with a stirrer, thermoregulator, thermometer and condenser, and the flask was heated in an oil bath to have the inside temperature of 80 to 90° C.

(2) A solution prepared by uniformly mixing and dissolving 0.7 g of methylhydroquinone in 856 g of glycerine monomethacrylate monoacrylate was charged into a dropping funnel equipped with a bypass, which was heated to 50° C. in advance. The solution in the dropping funnel was added dropwise to the contents of the flask of (1) above under agitation while the temperature of the contents of the flask was maintained at 80 to 90° C. in a nitrogen atmosphere, and stirred at the same temperature for 2 hours to cause a reaction.

(3) Then, after the temperature of the contents of the flask was lowered to 60° C., 366 g of an addition product of pentaerythritol with 4-mole propylene oxide (One mole of propylene oxide was added to four hydroxyl groups of pentaerythritol) charged in another dropping funnel was added dropwise to the flask quickly, and while the temperature of the contents of the flask was maintained at 80 to 90° C., a reaction was carried out for 4 hours to obtain a reaction product containing an urethane acrylate (I) and a radical polymerizable compound (morpholine acrylamide). The thus obtained reaction product was taken out from the flask while it was hot.

(4) The resulting reaction product was an achromatic viscous liquid at normal temperature (25° C.). The urethane acrylate (I) contained in the reaction product obtained in this Synthesis Example 1 was an urethane acrylate of the above general formula (I) in which p was 2, two $R^1$'s were a hydrogen atom and a methyl group, A was the residual glycerine group, q was 1, D was an isophorone group, E was a propylene oxide group (t=1) and r was 4.

SYNTHESIS EXAMPLE 2

[production of reaction product containing urethane acrylate (I) and radical polymerizable compound]

(1) 696 Grams of tolylene diisocyanate, 906 g of morpholine acrylamide and 1.0 g of dibutyltin dilaurate were charged into a 5-liter three-necked flask equipped with a stirrer, thermoregulator, thermometer and condenser, and the flask was heated in an oil bath to have the inside temperature of 80 to 90° C.

(2) A solution prepared by uniformly mixing and dissolving 0.7 g of methylhydroquinone in 856 g of glycerine monomethacrylate monoacrylate was charged into a dropping funnel equipped with a bypass, which was heated to 50° C. in advance. The solution in the dropping funnel was added dropwise to the contents of the flask of (1) above under agitation while the temperature of the contents of the flask was maintained at 80 to 90° C. in a nitrogen atmosphere, and stirred at the same temperature for 2 hours to cause a reaction.

(3) Then, after the temperature of the contents of the flask was lowered to 60° C., 366 g of an addition product of pentaerythritol with 4-mole propylene oxide (One mole of propylene oxide was added to four hydroxyl groups of pentaerythritol) charged in another dropping funnel was added dropwise to the flask quickly, and while the temperature of the contents of the flask was maintained at 80 to 90° C., a reaction was carried out for 4 hours to obtain a reaction product containing an urethane acrylate (I) and a radical polymerizable compound (morpholine acrylamide). The thus obtained reaction product was taken out from the flask while it was hot.

(4) The resulting reaction product was an achromatic viscous liquid at normal temperature (25° C.). The urethane acrylate (I) contained in the reaction product obtained in this Synthesis Example 2 was an urethane acrylate of the above general formula (I) in which p was 2, two $R^1$'s were a hydrogen atom and a methyl group, A was the residual glycerine group, q was 1, D was a tolylene group, E was a propylene oxide group (t=1) and r was 4.

SYNTHESIS EXAMPLE 3

[production of reaction product containing urethane acrylate and radical polymerizable compound]

(1) A reaction product containing a reaction product of isophorone diisocyanate and glycerine monomethacrylate monoacrylate and morpholine acrylamide was produced in a flask in the same manner as in (1) and (2) of the above Synthesis Example 1.

(2) Then, after the temperature of the contents of the flask was lowered to 60° C., 1,520 g of an addition product of pentaerythritol with 24-mole propylene oxide (6 moles on the average of propylene oxide were added to four hydroxyl groups of pentaerythritol) charged in another dropping funnel was added dropwise to the flask quickly, and while the temperature of the contents of the flask was maintained at 80 to 90° C., a reaction was carried out for 4 hours to obtain a reaction product containing an urethane acrylate and a radical polymerizable compound (morpholine acrylamide). The thus obtained reaction product was taken out from the flask while it was hot.

(3) The resulting reaction product was an achromatic viscous liquid at normal temperature (25° C.). The urethane acrylate contained in the reaction product obtained in this Synthesis Example 3 was an urethane acrylate of the above general formula (I) in which p was 2, two $R^1$'s were a hydrogen atom and a methyl group, A was the residual glycerine group, q was 1, D was an isophorone group, E was a propylene oxide group (t=6) and r was 4.

SYNTHESIS EXAMPLE 4

[production of reaction product containing urethane acrylate and radical polymerizable compound]

(1) A reaction product containing a reaction product of isophorone diisocyanate and glycerine monomethacrylate monoacrylate and morpholine acrylamide was produced in a flask in the same manner as in (1) and (2) of the above Synthesis Example 1.

(2) Then, after the temperature of the contents of the flask was lowered to 60° C., 135 g of pentaerythritol charged in another dropping funnel was added dropwise to the flask quickly, and while the temperature of the contents of the flask was maintained at 80 to 90° C., a reaction was carried out for 4 hours to obtain a reaction product containing an urethane acrylate and a radical polymerizable compound (morpholine acrylamide). The thus obtained reaction product was taken out from the flask while it was hot.

(3) The resulting reaction product was an achromatic viscous liquid at normal temperature (25° C.). The urethane acrylate contained in the reaction product obtained in this Synthesis Example 4 was an urethane acrylate of the above general formula (I) in which p was 2, two $R^1$'s were a hydrogen atom and a methyl group, A was the residual glycerine group, q was 1, D was an isophorone group, r was 4 and there was no group for E (having no alkylene oxide).

SYNTHESIS EXAMPLE 5

[production of reaction product containing urethane acrylate (I) and radical polymerizable compound]

(1) 888 Grams of isophorone diisocyanate, 906 g of morpholine acrylamide and 1.0 g of dibutyltin dilaurate were charged into a 5-liter three-necked flask equipped with a stirrer, thermoregulator, thermometer and condenser, and the flask was heated in an oil bath to have the inside temperature of 80 to 90° C.

(2) A solution prepared by uniformly mixing and dissolving 0.7 g of methylhydroquinone in a mixture containing 232 g of 2-hydroxyethyl acrylate and 260 g of 2-hydroxyethyl methacrylate was charged into a dropping funnel equipped with a bypass, which was heated to 50° C. in advance. The solution in the dropping funnel was added dropwise to the contents of the flask of (1) above under agitation while the temperature of the contents of the flask was maintained at 80 to 90° C. in a nitrogen atmosphere, and stirred at the same temperature for 2 hours to cause a reaction.

(3) Then, after the temperature of the contents of the flask was lowered to 60° C., 366 g of an addition product of pentaerythritol with 4-mole propylene oxide (One mole of propylene oxide was added to four hydroxyl groups of pentaerythritol) charged in another dropping funnel was added dropwise to the flask quickly, and while the temperature of the contents of the flask was maintained at 80 to 90° C., a reaction was carried out for 4 hours to obtain a reaction product containing an urethane acrylate (I) and a radical polymerizable compound (morpholine acrylamide). The thus obtained reaction product was taken out from the flask while it was hot.

(4) The resulting reaction product was an achromatic viscous liquid at normal temperature (25° C.). The urethane acrylate (I) contained in the reaction product obtained in this Synthesis Example 5 was a mixture of an urethane acrylate of the above general formula (I) in which p was 1, $R^1$ was a hydrogen atom, A was the residual glycerine group, q was 1, D was an isophorone group, E was a propylene oxide group (t=1) and r was 4 and an urethane acrylate of the above general formula (I) in which p was 1, $R^1$ was a methyl group, A is the residual glycerine group, q was 1, D was an isophorone group, E was a propylene oxide group (t=1) and r was 4.

EXAMPLE 1

[preparation of photocurable resin composition]

2,020 grams of the reaction product containing the urethane acrylate (I) and the radical polymerizable compound obtained in Synthesis Example 1, 454 g of morpholine acrylamide and 1,060 g of dicyclopentanyl diacrylate were charged into a 5-liter three-necked flask equipped with a stirrer, cooling pipe and a dropping funnel having a bypass, and the inside of the flask was depressurized, deaerated and substituted with nitrogen. Thereafter, 118 g of 1-hydroxycyclohexylphenyl ketone (IRGACURE 184, a product of Ciba Geigy AG: a photo-radical polymerization initiator) was added under ultraviolet light-protected environment, and the resulting mixture was mixed under stirring at a temperature of 25° C. until it was completely dissolved (mixing-under-stirring time of about 1 hour). Thus, a photocurable resin composition which was an achromatic, transparent and viscous liquid (viscosity of about 2,100 cp at normal temperature) was obtained.

EXAMPLE 2
[preparation of photocurable resin composition]

2,000 g of the reaction product containing the urethane acrylate (I) and the radical polymerizable compound obtained in Synthesis Example 1, 600 g of morpholine acrylamide and 1,400 g of dicyclopentanyl diacrylate were charged into a 5-liter three-necked flask equipped with a stirrer, cooling pipe and a dropping funnel having a bypass, and the inside of the flask was depressurized, deaerated and substituted with nitrogen. Thereafter, 133 g of 1-hydroxycyclohexylphenyl ketone which was the same as in Example 1 was added under ultraviolet light-protected environment, and the resulting mixture was mixed under stirred at a temperature of 25° C. until it was completely dissolved (mixing-under-stirring time of about 1 hour). Thus, a photocurable resin composition which was an achromatic, transparent and viscous liquid (viscosity of about 2,400 cp at normal temperature) was obtained.

EXAMPLE 3
[preparation of photocurable resin composition]

When a photocurable resin composition was prepared in the same manner as in Example 1 except that the reaction product containing the urethane acrylate (I) and the radical polymerizable compound obtained in Synthesis Example 2 was used as the urethane acrylate (I), the photocurable resin composition was an achromatic, transparent and viscous liquid (viscosity of about 2,000 cp at normal temperature).

Comparative Example 1
[preparation of photocurable resin composition]

When a photocurable resin composition was prepared in the same manner as in Example 1 except that the reaction product containing the urethane acrylate and the radical polymerizable compound obtained in Synthesis Example 3 was used in place of the reaction product of Example 1, the photocurable resin composition was an achromatic, transparent and viscous liquid (viscosity of about 2,000 cp at normal temperature).

Comparative Example 2
[preparation of photocurable resin composition]

When a photocurable resin composition was prepared in the same manner as in Example 1 except that the reaction product containing the urethane acrylate and the radical polymerizable compound obtained in Synthesis Example 4 was used in place of the reaction product of Example 1, the photocurable resin composition was an achromatic and transparent liquid having low fluidity (viscosity of about 200,000 cp at normal temperature).

EXAMPLE 4
[production of photo-cured molding by molding-by-mold method]

(1) The photocurable resin composition prepared in the above Example 1 was poured into a transparent silicon mold having a dumbbell test piece-shaped cavity which conformed with JIS 7113, and the entire surface of the silicon mold was irradiated with ultraviolet light from a 30W ultraviolet lamp for 15 minutes to cure the resin composition. Thus, a photo-cured dumbbell-shaped test sample molding having excellent transparency was obtained. The molding was taken out from the mold and measured for its tensile properties (tensile strength, elongation in tension and elastic modulus in tension) in accordance with JIS K 7113 to give the results shown in Table 1.

(2) When the thermal deformation temperature of the dumbbell-shaped test sample obtained in (1) above was measured by a method A (under a load of 18.5 kg/mm²)in accordance with JIS K7207, the result shown in Table 1 was obtained.

(3) Further, the volume shrinkage factor (%) of the test sample was obtained from the following equation (2) by measuring the specific gravity ($d_1$) before photo-curing of the photocurable resin composition used in the molding of Example 4 and the specific gravity ($d_2$) of the resulting molded item (dumbbell-shaped test sample) obtained, respectively. The result is shown in Table 1.

$$\text{volume shrinkage factor } (\%) = (d_1/d_2) \times 100 \quad (2)$$

EXAMPLE 5
[production of stereolithographed object by optical stereolithography]

Optical shaping was carried out, using the photocurable resin composition obtained in above Example 1 and an ultra high-speed optical shaping system (SOLIFORM500, a product of Teijin Seiki Co., Ltd.), by irradiating the resin composition with light from a water-cooled Ar laser (output of 500 mW; wavelengths of 333, 351 and 364 nm) from the direction perpendicular to the surface thereof, at an irradiation energy of 20 to 30 mJ/cm², at a slice pitch (thickness of each layer) of 0.127 mm and an average shaping time per layer of 2 min. Thus, a dumbbell-shaped stereolithographed object described in JIS 7113 was produced. The thus obtained stereolithographed object was cleaned with isopropyl alcohol to remove an uncured resin solution adhered to the shaped product and then, irradiated with 3 KW ultraviolet light for 10 minutes to post-cure the resin, whereby a stereolithographed object having excellent transparency was obtained. The stereolithographed object (dumbbell-shaped test sample) was measured for its tensile properties (tensile strength, elongation in tension and elastic modulus in tension) in accordance with JIS K 7113. The results are shown in Table 1.

The thermal deformation temperature of the thus obtained dumbbell-shaped test sample (stereolithographed object) after post-curing was measured in the same manner as in Example 4. The result is shown in Table 1.

Further, the volume shrinkage factor (%) of the dumbbell-shaped test sample was obtained from the above equation (2) by measuring the specific gravity ($d_1$) before photo-curing of the photocurable resin composition used in the stereolithographic method of Example 5 and the specific gravity ($d_2$) of the stereolithographed object after post-curing. The result is shown in Table 1.

EXAMPLE 6
[production of stereolithographed object by optical stereolithography]

Optical stereolithographing, cleaning of an uncured resin and post-curing were carried out in the same manner as in Example 5 except the photocurable resin composition obtained in above Example 2 was used to produce a stereolithographed object (dumbbell-shaped test sample) having excellent transparency. The tensile properties, thermal deformation temperature and volume shrinkage factor of the resulting dumbbell-shaped test sample (stereolithographed object) were measured in the same manner as in Example 5. The results are shown in Table 1.

EXAMPLE 7

[production of stereolithographed object by optical stereolithography]

Optical stereolithographing, cleaning of an uncured resin and post-curing were carried out in the same manner as in Example 5 except the photocurable resin composition obtained in above Example 3 was used to produce a stereolithographed object (dumbbell-shaped test sample) having excellent transparency. The tensile properties, thermal deformation temperature and volume shrinkage factor of the resulting dumbbell-shaped test sample (stereolithographed object) were measured in the same manner as in Example 5. The results are shown in Table 1.

Comparative Example 3

[production of stereolithographed object by optical stereolithography]

Optical stereolithographing, cleaning of an uncured resin and post-curing were carried out in the same manner as in Example 5 except the photocurable resin composition obtained in above Comparative Example 1 was used to produce a transparent stereolithographed object (dumbbell-shaped test sample). The tensile properties, thermal deformation temperature and volume shrinkage factor of the resulting dumbbell-shaped test sample (stereolithographed object) were measured in the same manner as in Example 5. The results are shown in Table 1.

Comparative Example 4

[production of photo-cured molding by molding-by-mold method]

Since it was difficult to use the viscous photocurable resin composition obtained in the above Comparative Example 2 in the optical stereolithography because of its extremely high viscosity, the photocurable resin composition obtained in Comparative Example 2 was poured into a transparent silicon mold having a dumbbell-shaped cavity which conformed with JIS 7113 in the same manner as in Example 4 and photo-cured in the same manner as in Example 4 to produce a dumbbell-shaped molding. The tensile properties, thermal deformation temperature and volume shrinkage factor of the resulting dumbbell-shaped test sample (molding by mold) were measured in the same manner as in Example 4. The results are shown in Table 1.

It is understood from the results of Table 1 above that the moldings by mold and stereolithographed objects obtained in Examples 4 to 7 by using the photocurable resin compositions of Examples 1 to 3 containing urethane acrylates included in the category of the urethane acrylate (I) of the present invention have extremely excellent heat resistance with a thermal deformation temperature much higher than 100° C., excellent dimensional stability with a small volume shrinkage factor at the time of photo-curing and excellent mechanical properties with high tensile strength and elastic modulus in tension.

In contrast, it is understood that the stereolithographed object obtained in Comparative Example 3 by using the photocurable resin composition of Comparative Example 1 containing the urethane acrylate which is an urethane acrylate of the above general formula (I) in which t (number of moles of propylene oxide added) is 6 and hence, is not included in the category of the urethane acrylate (I) of the present invention is inferior in heat resistance with an extremely low thermal deformation temperature of 58° C. and mechanical properties with an extremely small tensile strength and a low elastic modulus in tension. Further, it is also evident that the photocurable resin composition of Comparative Example 2 containing the urethane acrylate which has no (poly)alkylene oxide group for group E in the above general formula (I) and hence, is not included in the category of urethane acrylate (I) of the present invention is not a liquid because of its extremely high viscosity, cannot be used in the optical stereolithography and is inferior in dimensional accuracy with a large volume shrinkage factor at the time of photo-curing and that the obtained molding by mold is inferior in strength with an extremely small tensile strength.

EXAMPLE 8

[preparation of photocurable resin composition]

2,020 Grams of the reaction product containing the urethane acrylate (I) and the radical polymerizable compound obtained in Synthesis Example 5, 454 g of morpholine acrylamide and 1,060 g of dicyclopentanyl diacrylate were charged into a 5-liter three-necked flask equipped with a stirrer, cooling pipe and a dropping funnel having a bypass, and the inside of the flask was depressurized, deaerated and substituted with nitrogen. Thereafter, 118 g of

TABLE 1

| | | | Dumbbell-shaped test sample (photo-cured product) | | | | |
|---|---|---|---|---|---|---|---|
| Examples | Photo-curable resin composition | Production method | Tensile strength (kg/mm$^2$) | Elongation in tension (%) | Elastic modulus in tension (kg/mm$^2$) | Thermal deformation temperature (° C.) | Volume shrinkage factor[1] (%) |
| Ex. 4 | Example 1 | molding by mold | 7.1 | 1.8 | 389 | 137 | 6.4 |
| Ex. 5 | Example 1 | stereolithography | 6.1 | 1.4 | 391 | 127 | 6.4 |
| Ex. 6 | Example 2 | stereolithography | 6.5 | 2.0 | 399 | 148 | 6.0 |
| Ex. 7 | Example 3 | stereolithography | 6.1 | 1.0 | 388 | 151 | 6.5 |
| Comp. Ex. 3 | Comparative Example 1 | stereolithography | 4.5 | 7.0 | 279 | 58 | 6.2 |
| Comp. Ex. 4 | Comparative Example 2 | molding by mold | 4.5 | 0.5 | 379 | 158 | 9.8 |

(Note) Ex. = Example, Comp. Ex. = Comparative Example
[1]volume shrinkage factor at the time of photo-curing 1-hydroxycyclohexylphenyl ketone (photo-radical polymerization initiator) which was the same as in Example 1 was added under ultraviolet light-protected environment, and the resulting mixture was mixed under stirring at a temperature of 25° C. until it was completely dissolved (mixing-under-stirring time of about 1 hour). Thus, a photocurable resin composition which was an achromatic, transparent and viscous liquid (viscosity of about 2,900 cp at normal temperature) was obtained.

EXAMPLE 9
[preparation of photocurable resin composition containing filler]

2,800 Grams of the photocurable resin composition obtained in Example 1 was charged into an universal stirrer having inner volume of 10 liters (a product of Dalton Co. Ltd.), and 3,310 g (32% by volume based on the volume of the photocurable resin composition before addition of the filler) of glass beads [average particle size of 15 μm, relative standard deviation of sphericity obtained by the above equation (1) of 0.3] treated with an acrylsilane coupling agent [a product of Toshiba Silicone Co. Ltd, γ(methacryloxypropyl)-trimethoxysilane] and 993 g (8% by volume based on the volume of the photocurable resin composition before addition of the filler) of an aluminum borate whisker (ALBOREX YS-4, a product of Shikoku Kasei Kogyo Co. Ltd., diameter of 0.5 to 0.7 μm and aspect ratio of 50 to 70) treated with the same acrylsilane coupling agent as above were added, stirred for one day and defoamed to obtain a photocurable resin composition containing the filler (viscosity of about 42,000 cp at 25° C.).

EXAMPLE 10
[preparation of photocurable resin composition containing filler]

2,800 Grams of the photocurable resin composition obtained in Example 8 was charged into an universal stirrer having inner volume of 10 liters (a product of by Dalton Co., Ltd.) and 3,310 g (32% by volume based on the volume of the photocurable resin composition before addition of the filler) of glass beads [average particle size of 15 μm, relative standard deviation of sphericity obtained by the above equation (1) of 0.3] treated with an acrylsilane coupling agent [a product of Toshiba Silicone Co., Ltd., γ(methacryloxypropyl)-trimethoxysilane] and 993 g (8% by volume based on the volume of the photocurable resin composition before addition of the filler) of an aluminum borate whisker (Alborex YS-4, a product of Shikoku Kasei Kogyo Co. Ltd, diameter of 0.5 to 0.7 μm and aspect ratio of 50 to 70) treated with the same acrylsilane coupling agent as above were added, stirred for one day and defoamed to obtain a photocurable resin composition containing the filler (viscosity of about 49,000 cp at 25° C.).

EXAMPLE 11
[production of stereolithographed object by optical stereolithography]

Optical stereolithographing, cleaning of an uncured resin and post-curing were carried out in the same anner as in Example 5 except that the photocurable resin composition obtained in above Example 9 was used to produce a stereolithographed object (dumbbell-shaped test sample) having excellent transparency. The tensile properties, thermal deformation temperature and volume shrinkage factor of the resulting dumbbell-shaped test sample (stereolithographed object) were measured in the same manner as in Example 5. The results are shown in Table 2.

EXAMPLE 12
[production of stereolithographed object by optical stereolithography]

Optical stereolithographing, cleaning of an uncured resin and post-curing were carried out in the same manner as in Example 5 except that the photocurable resin composition obtained in above Example 10 was used to produce a stereolithographed object (dumbbell-shaped test sample) having excellent transparency. The tensile properties, thermal deformation temperature and volume shrinkage factor of the resulting dumbbell-shaped test sample (stereolithographed object) were measured in the same manner as in Example 5. The results are shown in Table 2.

TABLE 2

| | | | Dumbbell-shaped test sample (photo-cured product) | | | | |
|---|---|---|---|---|---|---|---|
| Example | Photo-curable resin composition | Filler[1] | Tensile strength (kg/mm$^2$) | Elongation in tension (%) | Elastic modulus in tension (kg/mm$^2$) | Thermal deformation temperature (° C.) | Volume shrinkage factor[2] (%) |
| Example 11 | Example 9 | A + B | 6.3 | 1.0 | 1378 | 251 | 1.8 |
| Example 12 | Example 10 | A + B | 9.4 | 2.4 | 1590 | 224 | 1.7 |

[1]filler
A: glass beads treated with acrylsilane coupling agent
B: aluminum borate whisker treated with acrylsilane coupling agent
[2]volume shrinkage factor at the time of photo-curing It is understood from the results of Table 2 above that, in Examples 11 and 12 in which stereolithographed objects are produced using the photocurable resin compositions of Example 9 and 10 which contain the urethane acrylate which is included in the category of the urethane acrylate (I) of the present invention, the other radical polymerizable compound and the photopolymerization initiator and further solid fine particles and whiskers, photo-cured products (stereolithographed objects) having extremely excellent heat resistance with an extremely high thermal deformation temperature higher than 200° C. can be obtained and that they have further improved dimensional accuracy with an extremely small volume shrinkage factor and excellent mechanical properties with a high tensile strength and elastic modulus in tension.

Since the photocurable resin composition of the present invention is a liquid which has low viscosity and excellent handling properties and can be cured in a short period of time, it can be effectively used in the production of various moldings, stereolithographed objects and other products by an irradiation method.

When the photocurable resin composition of the present invention is used, a molding or stereolithographed object having excellent dimensional accuracy can be obtained because of its small volume shrinkage factor at the time of photo-curing.

Further, a photo-cured product such as a molding or a stereolithographed object obtained by optically curing the photocurable resin composition of the present invention has extremely excellent heat resistance with a high thermal deformation temperature higher than 100° C. and excellent mechanical properties with a high tensile strength and elastic modulus in tension.

When at least one filler selected from solid fine particles and whiskers is contained in the photocurable resin composition of the present invention, the thermal deformation temperature of the obtained photo-cured product is further improved and the volume shrinkage at the time of photo-curing thereof is further reduced with the result that a molding or stereolithographed object having more excellent heat resistance and dimensional accuracy can be obtained.

What is claimed is:

1. A photocurable resin composition comprising:
   (A) a urethane acrylate represented by the following formula (I)

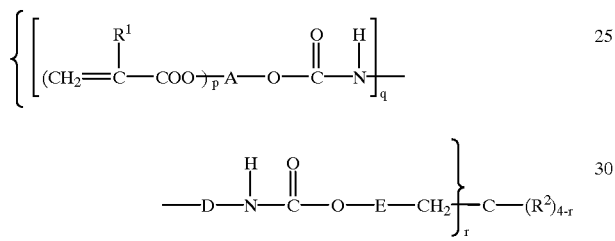

wherein $R^1$ is a hydrogen atom or a methyl group, A is a trivalent organic group which remains after all the hydroxyl groups are removed from a triol, D is a divalent or trivalent organic group which remains after all the isocyanate groups are removed from a diisocyanate or triisocyanate, E is a group represented by the formula —$(CH_2CH_2O)_s$— wherein s is a numeral of 1 to 4

wherein t is a numeral of 1 to 4 or

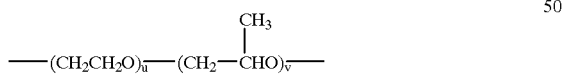

wherein u and v are each a numeral of 1 to 3, provided that u+v is 2 to 4, $R^2$ is a hydrogen atom or an alkyl group, p is 2 and q is 1 or 2, and r is 3 or 4, provided that at least one of $R^{1'}$ s is a methyl group;
   (B) a radical, polymerizable compound different from the above urethane acrylate; and
   (C) a photopolymerization initiator, the weight ratio of the urethane acrylate (A) to the radical polymerizable compound (B) being 80:20 to 10:90, further containing at least one filler selected from the group consisting of solid fine particles and whiskers.

2. The photocurable resin composition of claim 1, wherein the proportion of the photopolymerization initiator is 0.1 to 10% by weight based on the total weight of the urethane acrylate and the radical polymerizable compound.

3. The photocurable resin composition of claim 1 which contains whiskers having a diameter of 0.3 to 1 µm, a length of 10 to 70 µm and an aspect ratio of 10 to 100.

4. The photocurable resin composition of claim 1, wherein at least one filler selected from solid fine particles and whiskers has been treated with a silane coupling agent.

5. The photocurable resin composition of claim 1, wherein the content of the filler is 3 to 70% by volume based on the volume of the photocurable resin composition before it contains the filler.

6. The photocurable resin composition of claim 1, which is a resin composition for optically producing a stereolithographed object.

7. A photocurable resin composition comprising:
   (A) a urethane acrylate represented by the following formula (1):

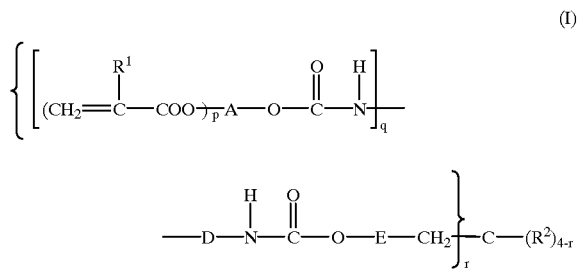

wherein $R^1$ is a hydrogen atom or a methyl group, A is a divalent or trivalent organic group which remains after all the hydroxyl groups are removed from a diol or triol, D is a divalent or trivalent organic group which remains after all the isocyanate groups are removed from a diisocyanate or triisocyanate, E is a group represented by the formula —$(CH_2CH_2O)_s$— wherein s is a numeral of 1 to 4,

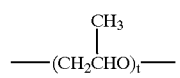

wherein t is a numeral of 1 to 4, or

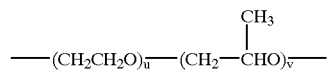

wherein u and v are each a numeral of 1 to 3, provided that u+v is 2 to 4, $R^2$ is a hydrogen atom or an alkyl group, p and q are independently 1 or 2, and r is 3 or 4, provided that at least one of $R^{1'}$ s is a methyl group when p is 2;
   (B) a radical polymerizable compound different from the above urethane acrylate; and
   (C) a photopolymerization initiator, the weight ratio of the urethane acrylate (A) to the radical polymerizable compound (B) being 80:20 to 10:90, further containing both solid fine particles and whiskers.

8. The photocurable resin composition of claim 7, wherein the solid fine particles are spherical solid fine particles hawing a smooth surface.

9. The photocurable resin composition of claim 7 which contains whiskers having a diameter of 0.3 to 1 µm, a length of 10 to 70 µm and an aspect ratio of 10 to 100.

10. A method of producing a stereolithographed object from a photocurable resin composition which comprises the steps of:

irradiating said photocurable resin composition containing an optical energy absorber with an actuation energy beam to form a cured layer, then applying another amount of said photocurable resin composition thereto and irradiating said composition with an activation energy beam to form a cured layer laminated thereon and, when required, repeating the lamination operation until the stereolithographed object is obtained;

wherein said photocurable composition consists essentially of (A) a urethane acrylate represented by the following formula (I);

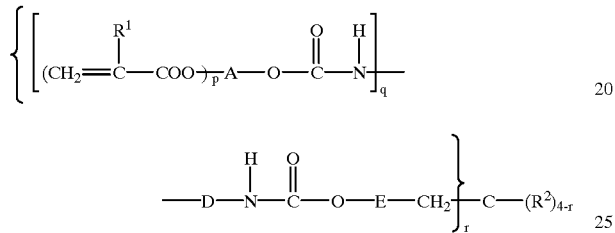

wherein $R^1$ is a hydrogen atom or a methyl group, A is a trivalent organic group which remains after all the hydroxyl groups are removed from a triol, D is a divalent or trivalent organic group which remains after all the isocyanate groups are removed from a diisocyanate or triisocyanate, E is a group represented by the formula $—(CH_2CH_2O)_s—$ wherein s is a numeral of 1 to 4

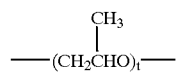

wherein t is a numeral of 1 to 4 or

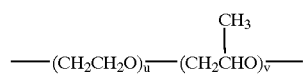

wherein u and v are each a numeral of 1 to 3, provided that u+v is 2 to 4, $R^2$ is a hydrogen atom or an alkyl group, p is 2 and q is 1 or 2, and r is 3 or 4, provided that at least one of $R^{1'}$ is a methyl group;

(B) a radical, polymerizable compound different from the above urethane acrylate; and (C) a photopolymerization initiator, the weight ratio of the urethane acrylate (A) to the radical polymerizable compound (B) being 80:20 to 10:90, further containing at least one filler selected from the group consisting of solid fme particles and whiskers.

* * * * *